United States Patent [19]

Tanaka

[11] Patent Number: 4,626,765

[45] Date of Patent: Dec. 2, 1986

[54] APPARATUS FOR INDICATING REMAINING BATTERY CAPACITY

[75] Inventor: Masafumi Tanaka, Kyoto, Japan

[73] Assignee: Japan Storage Battery Company Limited, Kyoto, Japan

[21] Appl. No.: 614,092

[22] Filed: May 25, 1984

[30] Foreign Application Priority Data

| May 25, 1983 | [JP] | Japan | 58-92967 |
| May 25, 1983 | [JP] | Japan | 58-92968 |
| May 30, 1983 | [JP] | Japan | 58-95445 |
| Jun. 24, 1983 | [JP] | Japan | 58-114475 |

[51] Int. Cl.$^4$ .......................... H02J 7/00; G08B 21/00
[52] U.S. Cl. ......................................... 320/48; 320/39; 340/636
[58] Field of Search ......................................... 320/2–5, 320/13, 39, 40, 48; 340/636; 324/429

[56] References Cited

U.S. PATENT DOCUMENTS

| 3,992,658 | 11/1976 | Bechtold et al. | 320/39 X |
| 4,027,231 | 5/1977 | Lohrmann | 320/48 X |
| 4,180,770 | 12/1979 | Eby | 320/48 X |
| 4,217,533 | 8/1980 | Van Beek | 320/39 X |
| 4,234,840 | 11/1980 | Konrad et al. | 320/48 |
| 4,320,334 | 3/1982 | Davis et al. | 320/48 |

FOREIGN PATENT DOCUMENTS 2742675 4/1979 Fed. Rep. of Germany ...... 340/636

*Primary Examiner*—R. J. Hickey
*Attorney, Agent, or Firm*—Sughrue, Mion, Zinn, Macpeak & Seas

[57] ABSTRACT

When the discharging of a battery is suspended, its open-circuit voltage or a voltage corresponding to the open-circuit voltage is detected, and with the voltage thus detected, as a start point an imaginary voltage curve having a certain decreasing rate is set for instance (by discharging a capacitor which has been charged by the voltage). When the discharging of the battery is suspended, the voltage detected at that time is used to correct the start point voltage of the imaginary voltage curve. According to the voltage obtained from the imaginary voltage curve, the number of LEDs turned on is changed or one of the LEDs is selected or liquid crystal display means is operated to display the remaining capacity of the battery.

6 Claims, 6 Drawing Figures

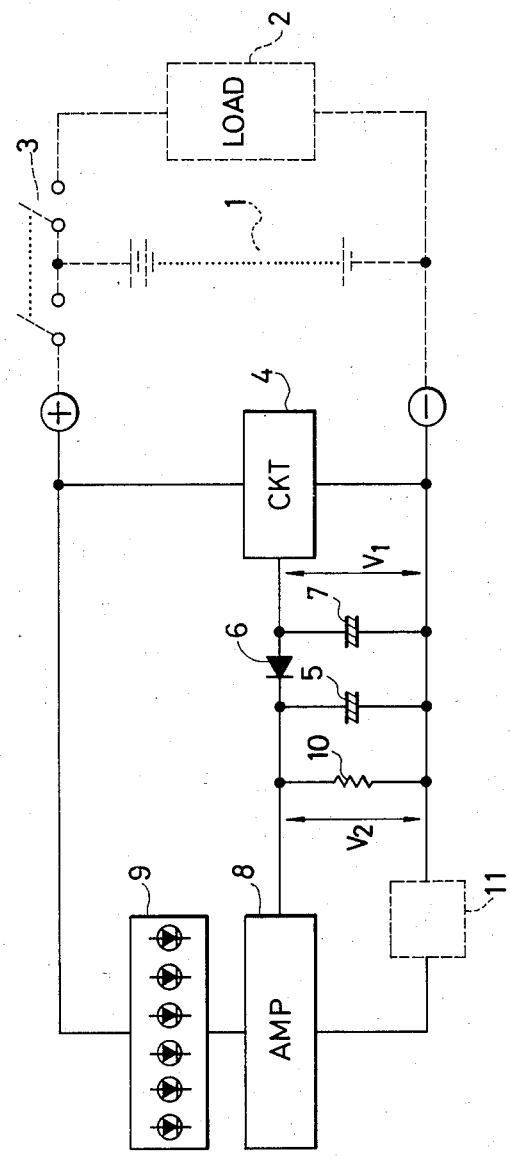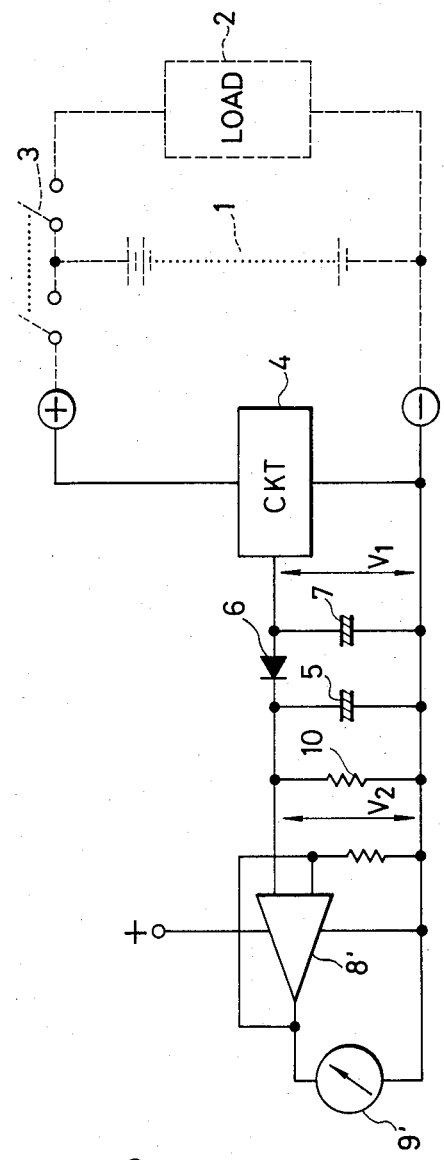
FIG. 1
FIG. 2

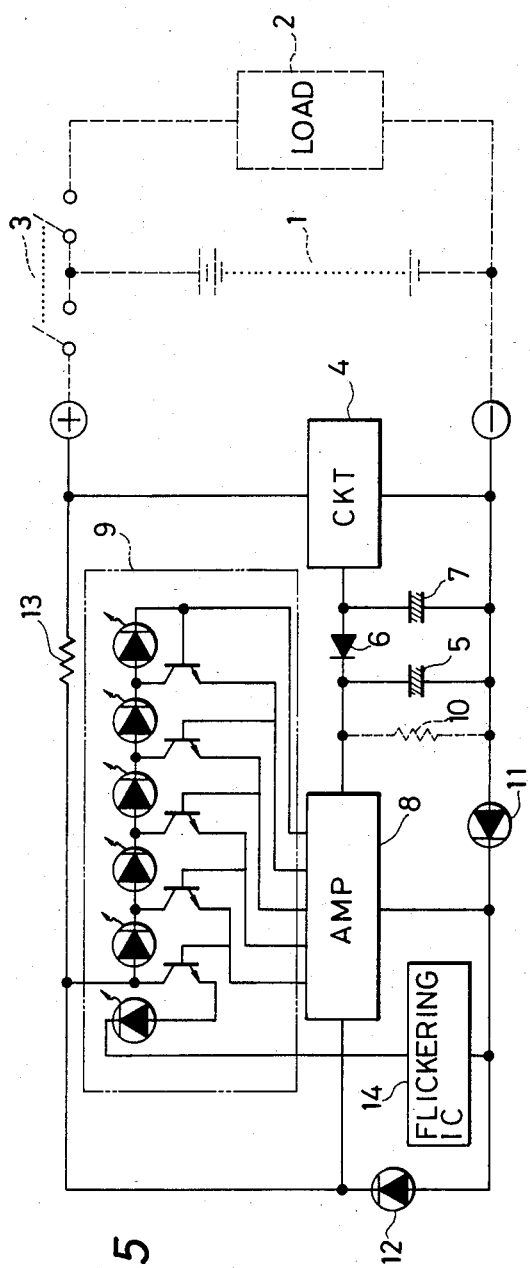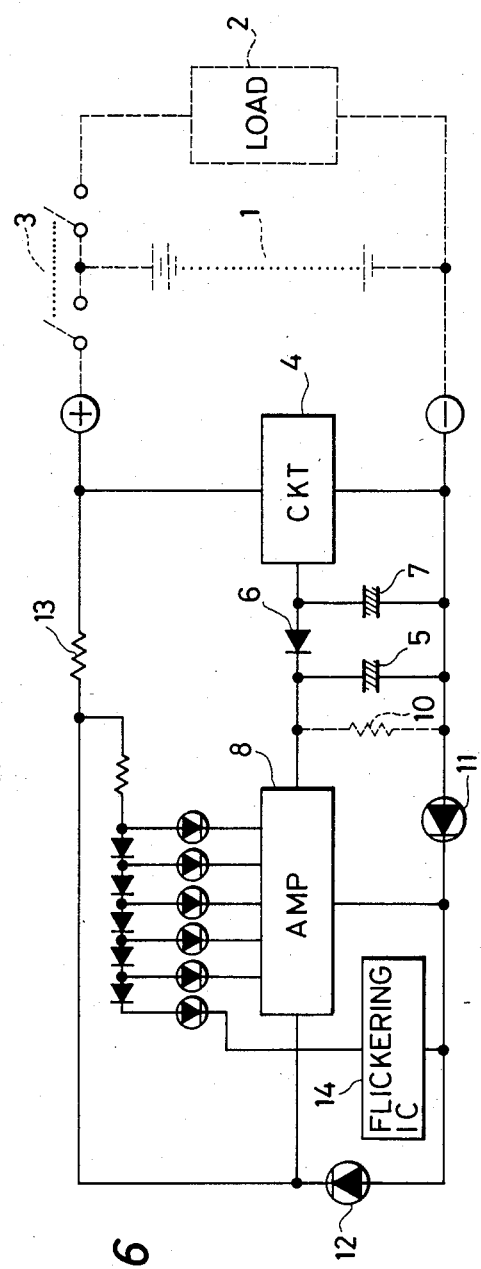
FIG. 5
FIG. 6

APPARATUS FOR INDICATING REMAINING BATTERY CAPACITY

BACKGROUND OF THE INVENTION

1. Technical Field of the Invention

This invention relates to a method of and apparatus for indicating battery capacity in which the remaining capacity of a battery during practical operation is indicated by a meter or is displayed in a digital mode by using a liquid crystal display unit or an LED display unit, and more particularly to a method of and apparatus for indicating battery capacity in which the remaining capacity of a battery during practical operation can be indicated not only when the battery is not discharged but also when it is being discharged.

2. Description of the Prior Art

In the most popular method of monitoring the battery capacity, the specific gravity of the electrolyte is measured to estimate the battery capacity. At the present time, this method is most accurate.

However, an excellent technique of converting the specific gravity of the electrolyte into an electrical signal is not provided yet. When the specific gravity is detected according to the above-described method, the sensor is usually inserted in the pilot cell only, and therefore it is difficult to detect accurately the condition of the battery other than that of the pilot cell. Furthermore, since the rate of decrease of the specific gravity during discharge depends on the type of battery and since the diffusion speed of the electrolyte in the battery depends on the configuration of a battery, the measured specific gravity must be adjusted according to battery type and battery configuration. Practically, it is too difficult to adjust them. In addition, in the case of fork lift use in which the battery is detachably mounted, the maintenance of the sensor circuit is troublesome, especially when the battery is exchanged, and often the sensor circuit becomes defective. Accordingly, for a movable battery such as a fork lift battery, the type of a remaining capacity monitor in which the sensor is inserted in a battery electrolyte to measure the specific gravity, is scarcely used. It is partially mounted only for some stationary batteries.

The capacity of an electric vehicle battery may be determined by using a voltmeter connected to the terminals thereof. However, the voltmeter cannot determine the remaining capacity of the electric vehicle battery. In this case, the capacity of the battery is determined from the minimum value which is indicated by the voltmeter when the battery is under load. In this method, the voltmeter used is a simple instrument and the indication of the capacity by voltmeter is relatively accurate. However, since the indication is always variable, it is difficult to determine the capacity with high accuracy for the operator until he becomes familiar with the behavior of the voltmeter.

In order to overcome this difficulty, a voltmeter for monitoring the battery capacity has been developed in which a capacitor is installed to delay the response of the meter thereby to prevent the abrupt operation of the pointer of the voltmeter. In addition, a method has been disclosed in which whenever the voltage of the battery is decreased sequentially to several particular preset values, the pointer of the voltmeter is electrically locked, so that the pointer is deflected stepwise as the capacity decreases. In these methods, the indication is variable or discontinuous, and the voltmeter, unlike a fuel gauge in an automobile, cannot continuously indicate the decrease of capacity during discharge. In order to eliminate this drawback, a system has been proposed, for instance, by U.S. Pat. No. 4,180,770 in which the open-circuit voltage of a battery is adjusted according to a voltage drop which occurs when the battery is discharged, and the open-circuit voltage thus adjusted is utilized to indicate the battery capacity thereof. Namely, the open-circuit voltage in this system indicates the remaining capacity of a battery which is able to discharge still more. Therefore, a capacity meter according to this system currently may be the most practical. However, this system is still disadvantageous in the following points: Since the battery capacity generally depends on the load profile applied to the battery, it is necessary to adjust the open-circuit voltage of the battery according to the load profile applied thereto. In addition, in the case when the battery has been replaced by another one, the capacity is not indicated unless a load is connected to the battery, even if the capacity of the battery has been reduced.

A remaining capacity meter based on two factors, load current and voltage drop, was used before. However, the adjustment of the meter includes the control of two variables, is very difficult. It is necessary to use a shunt resistor for current detection, and the detecting circuit is intricate.

SUMMARY OF THE INVENTION

An object of this invention is to provide a method of indicating a battery capacity in which the above-described difficulties accompanying conventional determining methods have been eliminated, and a device for employing the method.

Another object of the invention is to provide a display unit suitable for displaying the remaining capacity of a battery.

In a battery discharged intermittently, such as one for an electric vehicle, the stable open-circuit voltage provided when the discharging is suspended (under no load) is theoretically proportional to the capacity of the battery or the specific gravity of the electrolyte, and therefore as the capacity or the specific gravity decreases the voltage is decreased. Based on this fact, the invention is intended to provide a remaining capacity meter of a battery in which the stable open-circuit voltage provided when the discharging is suspended is detected, the open-circuit voltage thus detected is stored for instance by a capacitor, the voltage of the capacitor is subjected to impedance conversion by an IC having a high internal impedance such as an operational amplifier or an LED lighting level IC to set the imaginary voltage curve corresponding to the open-circuit voltage curve of the battery, and a voltage obtained from the imaginary voltage curve is displayed by a meter or a liquid crystal display unit, or by changing the number of LEDs lighted to indicate the remaining capacity of the battery.

When the battery is generally being discharged, the voltage of the battery is greatly changed depending on the amount of discharge current. Therefore, when the battery is being discharged, it is unsuitable to use the voltage of the battery to indicate its capacity. However, in this invention, the decreased voltage of the capacitor is utilized as an imaginary voltage curve corresponding to the open-circuit voltage curve of a battery under operation so that even when the battery is being discharged, the capacity is indicated through conversion of the capacitor's voltage. When the discharging is suspended some for a time, the stable open-circuit voltage is utilized to charge the capacitor again, so that the start point of the imaginary voltage curve is corrected to indicate the capacity substantially accurately.

As is clear from the above description, in the method of this invention, the voltage of the battery is not detected while the battery is being discharged, the capacity can be indicated both when the battery is in operation and when it is not in operation. Furthermore, the device of this invention, unlike the conventional various capacity meters, can check the capacity without the detection of the discharging current, and positively determine the capacity of a battery which is allowed to stand, thus contributing to the maintenance of batteries.

BRIEF DESCRIPTION OF THE DRAWINGS

FIG. 1 is a circuit diagram showing one example of a circuit for practicing a method of indicating a remaining capacity of a battery according to the invention.

FIG. 2 is a circuit diagram showing another example of the circuit for practicing the method according to the invention.

FIGS. 4 and 5 are circuit diagrams showing examples of a circuit in which a display unit 9 is made up of a plurality of LEDs and the remaining capacity of the battery is indicated by the number of LEDs lighted, FIG. 5 showing the case where the LEDs are connected in series to one another.

FIG. 6 is a circuit diagram showing one example of a circuit in which a plurality of LEDs form a display unit 9 and one of the LEDs is selectively turned on to indicate the remaining capacity of the battery.

DETAILED DESCRIPTION OF PREFERRED EMBODIMENTS

Figure 3:
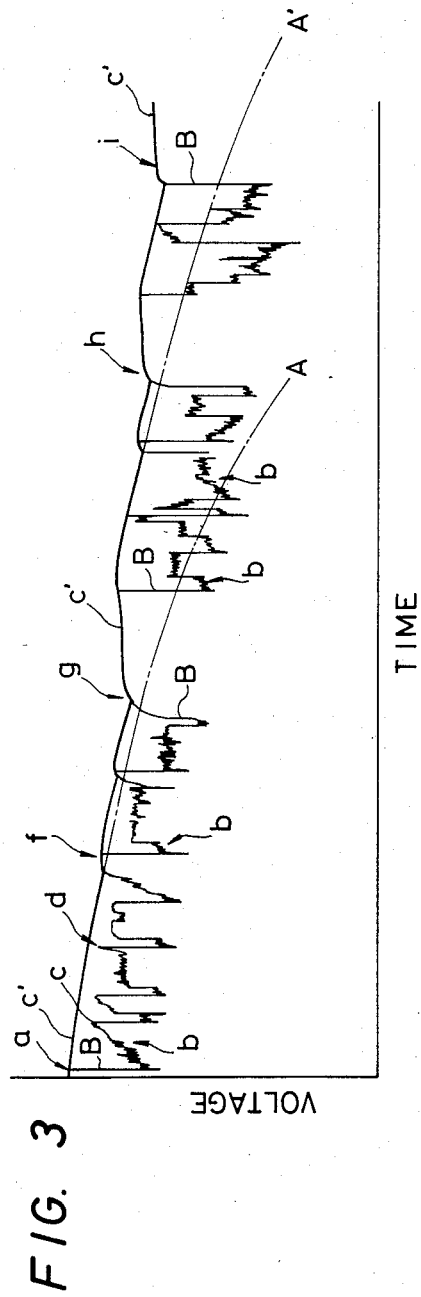
FIG. 3 is an explanatory diagram for a description of the method according to the invention.

A method of indicating the remaining capacity of a battery and a device for displaying the method according to the invention will be described with reference to the accompanying drawings.

FIG. 1 shows a first example of a circuit for embodying the invention. In FIG. 1, reference numeral 1 designates a battery to be monitored (hereinafter referred to merely as "a battery 1", when applicable); 2, a load; 3, a load applying switch; and 4, a circuit connected to both terminals of the battery 1. The circuit 4 is to obtain a voltage which is obtained by subtracting a certain voltage from the open-circuit voltage of the battery 1, i.e., the battery voltage which is provided when the battery 1 is not in operation. The circuit 4 may be formed in various manners. For instance, it may be formed by a series circuit of a constant voltage diode and a resistor in such a manner that the certain voltage is subtracted by the constant voltage diode, and the variation of the electromotive force, corresponding to the decrease of a battery capacity, is obtained from a voltage which is provided by dividing the remaining voltage. The reason for the provision of the circuit 4 is that, for instance when a battery of twenty-four cells where open-circuit voltage is about 51 V, is used as the battery 1, the actual variation of the open-circuit voltage of the battery is only about 4 V, and then the circuit 4 is effective for operating an indicator such as a meter (described later) in this narrow voltage range. Further in FIG. 1, reference numeral 5 designates a capacitor which is charged by a voltage provided by the circuit 4. The capacitor 5 is connected in parallel to the circuit 4 through a reverse-current preventing element 6 such as a silicon diode. Accordingly, the capacitor 5 is charged by a stable voltage from which is subtracted the certain voltage from the open-circuit voltage of the battery 1 and then divided by circuit 4. And even when the voltage provided by the circuit 4 becomes lower than the voltage of capacitor 5 because of the terminal voltage drop of battery 1 due to the connection to the load 2, the capacitor 5 is not discharged to the circuit 4. Reference numeral 7 designates a capacitor which, when a higher voltage is developed across the terminals of the battery 1 by regenerative control or chopper control, absorbs such higher (pulse) voltage. Reference numeral 8 designates an amplifier utilizing an LED lighting level IC; and its input terminal is connected to the capacitor 5. Reference numeral 9 designates a display unit comprising a plurality of LED display elements or meters. When a very small current (substantially without the discharge of the capacitor 5) proportional to the voltage of the capacitor 5 is caused to flow in the amplifier 8 to operate the display unit 9, an indication proportional to the voltage of the capacitor 5 is displayed on the display unit 9. Similarly, the LED lighting level IC also can turn on the LED in proportion to the voltage. The voltage of the capacitor 5 is the open-circuit voltage of the battery 1 as long as no voltage leakage occurs, which is provided by circuit 4 before it is discharged. However, since the capacitor and the amplifier 8 such as an operational amplifier or an LED lighting level IC have high impedances, the capacitor 5 is discharged through the high impedance, as a result of which the voltage of the capacitor 5 is gradually decreased with time. Therefore, if the degree of decrease of the voltage of the capacitor 5 is set to a suitable value, then the curve of decrease of the voltage can be approximately utilized as a voltage curve instead of the curve of decrease of the actual open-circuit voltage of the battery 1. The capacitor 5 is charged by the open-circuit voltage again when the discharging of the battery 1 is suspended for a time, as a result of which the voltage of the capacitor 1 is corrected. Accordingly, the voltage of the capacitor 5 will not greatly differ from a value corresponding to the open-circuit voltage of the battery 1 which decreases as the battery is discharged; that is, it is maintained equally to a voltage corresponding to the open-circuit voltage of the battery 1 at all times.

The open-circuit voltage E of the battery 1, being expressed by an approximate expression $E = 0.84 + SG$ (electrolyte's specific gravity), is in proportion to the specific gravity of the electrolyte used and the capacity. Accordingly, to detect the voltage of the capacitor 5 corresponding to the open-circuit voltage is to detect the capacity of the battery 1 or the specific gravity of the electrolyte.

In the above-described example in FIG. 1, as the range of capacity of the battery is displayed, in a full-scale manner, on the display unit 9 such as a meter, or an LED or liquid crystal display unit, the data can be readily read and the condition of the battery 1 can be displayed accurately.

FIG. 2 shows a second example of the circuit in which an operational amplifier 8' is employed instead of the amplifier 8 in FIG. 1 and a meter 9' is used as the display unit.

As conducive to a better understanding of the method of indicating the remaining capacity of a battery according to the invention, it will be described with reference to FIGS. 1, 2 and 3 from another view point. FIG. 3 shows an operational characteristic. In FIG. 3, a imaginary voltage curve which is obtained by discharging the capacitor 5 is indicated by one-dot chain line A, and the setting of the curve can be adjusted by suitably selecting the capacitance and the impedance of capacitor, amplifier, etc. The solid line B indicates the voltage $V_1$ of the circuit 4 which is obtained from the terminal voltage of the battery 1, and the solid line C indicates the voltage $V_2$ of capacitor 5.

The capacitor 5 is not discharged to the circuit 4 because of the presence of the reverse-current preventing element 6, but it is discharged through the internal impedance of the amplifier and the internal impedance of the capacitor 5. However, since the internal impedances are very high, the time constant of an RC circuit composed of the impedances and the capacitor 5 is considerably long and unstable. In order to make the time constant of the RC circuit as stable as possible, a high resistor 10 is connected in parallel to the capacitor 5; that is, each imaginary voltage curve A in FIG. 3 is adjusted by insertion of the high resistor 10. In each imaginary voltage curve A, the time constant is set to a shorter value than the time required for the battery F to discharge completely. So that if the discharging of the battery is suspended, the start point of the imaginary voltage curve A is corrected by the voltage under no load as well as possible, for example, as shown by one-dot chain line A' in FIG. 3, and the voltage of the storing capacitor 5 is made close to the voltage under no load.

Now, assume that a battery for electric vehicle use is completely discharged in four to eight hours. When the capacitor 5 is so selected that the time constant of an RC circuit composed of the internal impedances of the capacitor 5 and the amplifier 8, the leakage current of the capacitor itself and the high resistor 10 is smaller than one hour, the capacitor 5 is discharged along the voltage curve indicated by the one-dot line A in FIG. 3, and accordingly, the voltage of the capacitor 5 is decreased along the curve A until current is supplied again from the side of the circuit 4.

In FIG. 3, the point a represents the voltage $V_1$ of the circuit 4 which is provided when the completely charged battery 1 is allowed to stand under no load. In this case, at the part a the capacitor 5 is charged by the voltage $V_1$ of the circuit 4, so that the voltage $V_2$ of the capacitor 5 becomes equal to the voltage $V_1$. When, under this condition, the battery 1 is discharged, the terminal voltage of the battery 1 is decreased according to the load, and accordingly the voltage $V_1$ is decreased according to the load, and accordingly the voltage $V_1$ of the circuit 4 is also decreased as indicated by the part b in FIG. 3, thus becoming lower than the voltage $V_2$ of the capacitor 5. However, because of the presence of the reverse current preventing element 6, the voltage $V_2$ of the capacitor 5 is decreased gradually according to the imaginary voltage curve A without following the voltage $V_1$. The gradual decrease of the voltage $V_2$ is displayed on the display unit 9; that is, the gradual decrease of capacity is indicated. However, the voltage drop of the capacitor 5 is fundamentally on assumption; that is, that is not always based on the decrease of the electromotive force (open-circuit voltage) of the battery.

In FIG. 3, at the parts c and d the discharging of the battery 1 is suspended. As the period of suspension is short, the open-circuit voltage of the battery 1 is not sufficiently restored and the voltage $V_1$ is not as high as the voltage of the imaginary voltage curve A. Therefore, the capacitor 5 is not charged through the element 6, and the meter 9 still indicates the capacity according to the curve A. However, at the part f the discharging of the battery is suspended for a sufficiently long period, and therefore the open-circuit voltage of the battery 1 is sufficiently restored and the voltage $V_1$ becomes higher than the voltage of the curve A. Accordingly, the capacitor 5 is charged through the element 6 by the voltage of the circuit 4 again, as a result of which the voltage of the capacitor 5, being corrected as indicated by the part f of the solid line C in FIG. 3, shows a voltage corresponding to the actual open-circuit of the battery 1. As is apparent from the above description, when the discharging of the battery 1 is suspended for a certain period, the voltage of the capacitor 5 corresponds to the correct open-circuit voltage of the battery 1 at that time. In FIG. 3, at the parts g and h also the capacitor 5 is charged and its voltage is corrected. After the correction at the part g, the imaginary voltage curve is indicated at the curve A'. Accordingly, whenever the discharging of the battery 1 is suspended for the certain period, the indication of the capacity on the display unit 9 is corrected, thus showing the correct capacity of the battery 1 at that time. If the battery 1 is discharged at a high rate, the open-circuit voltage is restored more slowly, and therefore the voltage of the capacitor 5 is not corrected and the indication is greatly decreased. In this case, this phenomenon is practically suitable because the capacity of the battery to be utilized becomes smaller by the high rate discharge.

As is clear from the above description, in the invention, merely by connecting the device of the invention to the battery 1, the remaining capacity (discharge state) of the battery 1 can be detected and the voltage variation of the circuit 4 indicates the characteristic of the battery 1 itself. Therefore, the display unit 9 indicates the capacity of the battery 1 which is obtained through the temperature correction. Furthermore, when the battery 1 is discharged at a high rate, the apparent electromotive force is greatly decreased as the actual battery capacity to be utilized decreases, and therefore the display unit 9 indicates the corrected value, similarly as in the above-described case. In addition, the current consumption of the device of the invention is not more than about fifteen milli-amperes. This means that it is easy to indicate the capacity of the battery with high accuracy both when the battery is being discharged and when it is allowed to stand.

Now, three more examples of the circuit according to the invention will be described. These examples are based on the same principle described above in which the voltage of the capacitor 5 which has stored a voltage corresponding to the apparent electromotive force is subjected to impedance conversion in the LED lighting level IC 8. The circuit of the LED display unit is changed so that the number of LEDs lighted and the position of the LED lighted indicates the remaining capacity of the battery.

Figure 4:
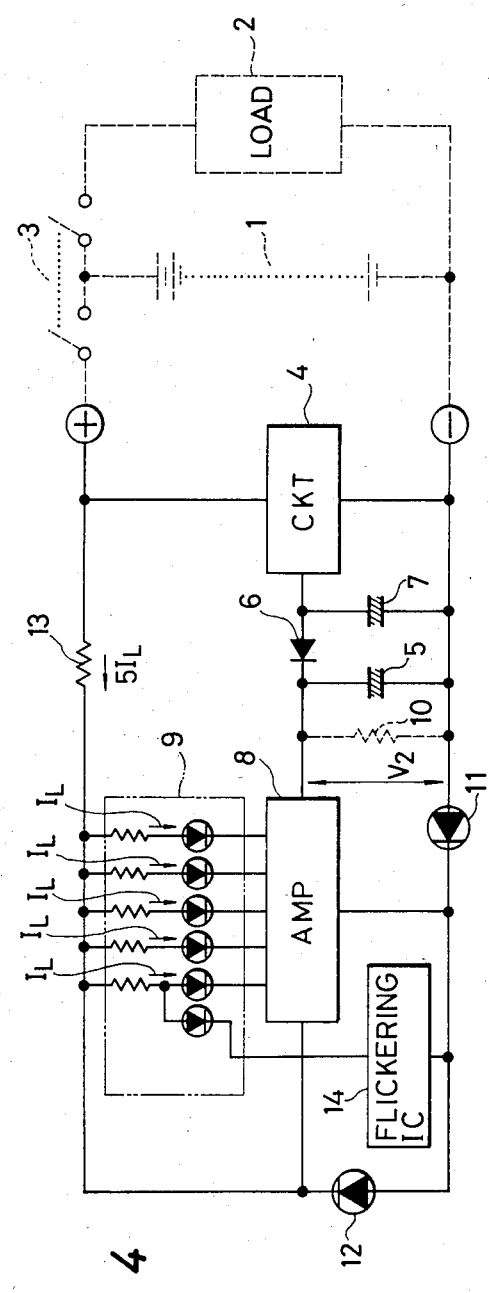

In FIG. 4, a display unit 9 comprises a plurality of LEDs which have first terminals connected through a current limiting resistor 13 to the power source and second terminals connected to the output terminals of an LED lighting level IC 8, respectively. According to the voltage of the capacitor 5, the LEDs are successively lighted so that the number of LEDs lighted indicates the remaining capacity of the battery. In FIG. 4, reference numeral 11 designates a Zener diode, which may be eliminated depending on the kind of the level IC 8 or the arrangement of the circuit 4; 12 designates a Zener diode for limiting the voltage of a power source 5 for the level IC; and 14 designates a flickering IC for causing the LED to flicker thereby to draw attention.

In the above-described example, the remaining capacity of the batery is indicated by the number of LEDs lighted; however, when an oscillating IC is connected to the output terminal of the first stage, the discharge condition can be indicated by the flickering of the LED.

In the example shown in FIG. 5, a plurality of LEDs are connected in series. One end of the series circuit of the LEDs is connected through a current limiting resistor 13 to the power source, while the other end is connected to the output terminal of the last stage of the LED lighting level IC 8 which is activated lastly as the level of an input to the level IC 8 increases. NPN transistors are connected between each pair of series-connected LEDs and the output terminals of the LED lighting level IC 8, except the last one, in such a manner that the collectors are connected to the connecting points and the emitters are connected to these output terminals, and that the base of each transistor is connected to the output terminal of the level IC which is activated by a higher input level than that which activates the output terminal to which the emitter of the transistor is connected. The example in FIG. 5 is similar to that in FIG. 4 in that the remaining capacity of the battery is indicated by the number of LEDs lighted. However, since the LEDs are series-connected, the current consumption is of one LED irrespective of the number of LEDs lighted on at all times. Accordingly, the amount of heat generated by the current limiting resistor 13 is very small, and the circuit can be provided in a compact capacity meter case.

In the example shown in FIG. 6, one end of each of the LEDs are connected to the output terminals of the LED lighting level IC, respectively, and diodes are connected between the other side ends of each of LEDs, respectively, so that one of the LEDs is selectively turned on according to the voltage drop of the battery, thereby to indicate the remaining capacity of the battery.

The typical examples of the displaying method using LEDs have been described; however, if high impedance elements are employed, the voltage of the capacitor 5 can be displayed in a digital mode by using a liquid crystal unit, so that the remaining capacity of the battery is indicated more quantitatively.

In the above-described examples, the discharging of the capacitor is utilized to set the imaginary voltage curve of the battery; however, the invention is not limited thereto or thereby. That is, any other electronic elements or circuits may be utilized if they can set the aforementioned imaginary voltage curve. Furthermore, in the above-described examples, in order to operate the display unit in full scale, the voltage obtained by subtracting the certain voltage from the open-circuit voltage is utilized; however, instead of the subtraction of the certain voltage, means for magnifying the indication of the capacity meter of a necessary range may be provided for the display unit, or the subtraction of the certain voltage may be made at a stage immediately before the display unit.

What is claimed is:

1. A device for displaying a remaining capacity of a battery, which comprises:
   means for detecting an open-circuit voltage of a battery or a voltage corresponding to said open-circuit voltage;
   means for setting a first imaginary voltage curve whose start point is determined by said voltage detected immediately before the discharging of said battery with respect to the open-circuit voltage of said battery which decreases as said battery is discharged and increases after a predetermined period during which discharge is suspended;
   means, responsive to a battery no-load condition existing for a predetermined time, for correcting said start point, whereby a corrected imaginary voltage curve is produced; and
   means for displaying a remaining capacity of said battery according to a voltage obtained from one of said first and corrected imaginary voltage curves, wherein said display means comprises:
   amplifier means;
   a plurality of LEDs connected in series to one after another in such a manner that one end of said series circuit of LEDs is connected through a current limiting resistor (13) to a power source and the other end is connected to the output terminals of the last stage of said amplifier means (8) which is activated lastly as the level of an input to said amplifier means increases; and
   NPN transistors connected between connecting points of said LEDs and the output terminals of said amplifier means, except for the last of said LEDs, in such a manner that the collectors of said NPN transistors are connected to said connecting points and the emitters of said NPN transistors are connected to said output terminals, the base of each transistor being connected to the output terminal of the rear stage of said amplifier means which is activated by an input level higher than that which activates the output terminal to which the emitter of said transistor is connected;
   said plurality of LEDs being successively turned off by said amplifier means to display a remaining capacity of said battery in response to a voltage drop of said capacitor.

2. A device for displaying a remaining capacity of a battery, which comprises:
   circuit means for detecting a voltage substantially corresponding to an open-circuit voltage of a battery, said circuit means being connected between both terminals of said battery to obtain said voltage which is provided by subtracting a predetermined voltage from the open-circuit voltage of said battery;
   a reverse current preventing element;
   capacitor means for setting a first imaginary voltage curve with said voltage detected immediately before the discharging of said battery as a first start point of said first imaginary voltage curve with respect to the open-circuit voltage of said battery which decreases as said battery is discharged, said capacitor being charged by a voltage provided by said circuit means after discharge of said battery is suspended for a predetermined time, and connected through said reverse current preventing element in parallel to said circuit means, whereby said first start point is corrected, whereby a corrected imaginary voltage curve is produced;

amplifier means for subjecting a voltage of said capacitor to impedance conversion and amplification; and display means for displaying a remaining capacity of said battery according to a voltage obtained from one of said first and corrected imaginary voltage curves, said display means comprising a plurality of LEDs connected to the output terminals of said amplifier means, and said plurality of LEDs being successively turned off by said amplifier means to display a remaining capacity of said battery in response to a voltage drop of said capacitor, and wherein said display means further comprises:

a plurality of LEDs connected in series to one after another in such a manner that one end of said series circuit of LEDs is connected through a current limiting resistor (13) to a power source and the other end is connected to the output terminals of the last stage of said amplifier means (8) which is activated lastly as the level of an input to said amplifier means increases; and NPN transistors connected between connecting points of said LEDs and the output terminals of said amplifier means, except for the last of said LEDs, in such a manner that the collectors of said NPN transistors are connected to said connecting points and the emitters of said NPN transistors are connected to said output terminals, the base of each transistor being connected to the output terminal of the rear stage of said amplifier means which is activated by an input level higher than that which activates the output terminal to which the emitter of said transistor is connected;

said plurality of LEDs being successively turned off by said amplifier means to display a remaining capacity of said battery in response to a voltage drop of said capacitor.

3. A device for displaying a remaining capacity of a battery, said device comprising:

means for detecting an open-circuit voltage of a battery or a voltage corresponding to said open-circuit voltage;

means for setting an imaginary voltage curve whose start point is determined by said voltage detected immediately before the discharging of said battery with respect to the open-circuit voltage of said battery which decreases as said battery is discharged; and means for displaying a remaining capacity of said battery according to a voltage obtained from said imaginary voltage curve, said display means comprising:

amplifier means;

a plurality of LEDs each having first and second ends, said first ends being connected to output terminals of said amplifier means;

a plurality of diodes, different from said LEDs, each of said diodes being connected between pairs of second ends of said LEDs, whereby all of said second ends of said LEDs are connected, and whereby all of said second ends of said LEDs are connected at a single point to a power source, one of said LEDs being selectively turned on to indicate a remaining capacity of said battery.

4. A device as claimed in claim 1, wherein said display means further comprises an oscillating IC connected between said power source and a predetermined one of said LEDs, for causing said predetermined one of said LEDs to flicker, thereby to draw attention to said display means.

5. A device as claimed in claim 2, wherein said display means further comprises an oscillating IC connected between said power source and a predetermined one of said LEDs, for causing said predetermined one of said LEDs to flicker, thereby to draw attention to said display means.

6. A device as claimed in claim 3, wherein said display means further comprises an oscillating IC connected between said power source and a predetermined one of said LEDs, for causing said predetermined one of said LEDs to flicker, thereby to draw attention to said display means.

* * * * *